US005408200A

United States Patent [19]

Buhler

[11] Patent Number: 5,408,200
[45] Date of Patent: Apr. 18, 1995

[54] INTELLIGENT PHASE DETECTOR

[75] Inventor: Otto Buhler, Boulder, Colo.

[73] Assignee: Storage Technology Corporation, Louisville, Colo.

[21] Appl. No.: 193,622

[22] Filed: Feb. 8, 1994

Related U.S. Application Data

[63] Continuation of Ser. No. 992,907, Dec. 18, 1992, abandoned.

[51] Int. Cl.⁶ .............................................. H03L 7/00
[52] U.S. Cl. .................................... 331/1 A; 331/11; 331/12; 331/25; 375/371; 375/374; 375/376; 327/156; 327/292; 360/51
[58] Field of Search ............... 307/510, 511, 514, 269, 307/262, 526, 603; 328/133, 134, 155; 331/1 A, 10, 11, 12, 17, 25; 375/119, 118, 120; 360/51, 46, 44, 45, 39

[56] References Cited

U.S. PATENT DOCUMENTS

| 3,555,194 | 1/1971 | Goto ................................... 331/12 X |
| 3,792,478 | 2/1974 | Parquier et al. ................... 331/12 X |
| 3,819,919 | 6/1974 | McGunigle ..................... 331/1 A X |
| 4,535,459 | 8/1985 | Hogge, Jr. ............................. 375/80 |
| 4,873,491 | 10/1989 | Wilkins ............................... 328/155 |
| 4,888,564 | 12/1989 | Ishigaki ............................... 331/1 A |
| 4,899,071 | 2/1990 | Morales ............................... 307/605 |
| 4,970,609 | 11/1990 | Cunningham et al. ............... 360/51 |
| 5,054,038 | 10/1991 | Hedberg .............................. 375/118 |
| 5,146,121 | 9/1992 | Searles et al. ........................ 307/603 |
| 5,206,601 | 4/1993 | Ready ................................... 329/317 |
| 5,212,601 | 5/1993 | Wilson ................................. 360/51 |

OTHER PUBLICATIONS

"DP8459 All-Code Data Synchronizer," National Semiconductor Preliminary Data Sheet, Mar. 1988, pp. 1-36.

W. Llewellyn et al., "A 33 Mbit/sec Data Synchronizing Phase-Locked-Loop Circuit," National Semiconductor Application Note, (date unknown).

Boyd et al., "Low Voltage, Low Cost, High Speed Charge Pump with High/Low Gain Operations", IBM Technical Disclosure Bulletin, vol. 27, No. 9, pp. 5210-5211, Feb. 1985.

Davie et al., "Simplified Phase-Locked Loop", IBM Technical Disclosure Bulletin, vol. 25, No. 3B, pp. 1615-1619, Aug. 1982.

Primary Examiner—Robert J. Pascal
Assistant Examiner—Arnold Kinkead
Attorney, Agent, or Firm—Sterne, Kessler, Goldstein & Fox

[57] ABSTRACT

A system and method for a computer based system for enabling data phase clock corrections. Basing these corrections primarily on errors that cause consistent phase shift errors while reducing the effect of random data phase errors. An improved phase-locked loop (PLL) is used where multiple data bits are examined simultaneously, allowing us to examine "apparent future" and "apparent late" data. The average phase adjustment to the data window is calculated based upon the examined data bits.

17 Claims, 4 Drawing Sheets

INTELLIGENT PHASE DETECTOR

This application is a continuation of application Ser. No. 07/992,907, filed Dec. 18, 1992, and now abandoned.

BACKGROUND OF THE INVENTION

1. Field of Invention

The present invention relates generally to computer data retrieval systems. More particularly the present invention relates to phase-locked-loops (PLL) for adjusting phase differences between transmitting and receiving mechanisms. Specifically, the present invention relates to a computer based system and method for receiving data from memory and adjusting for mechanical speed variations of the external and/or internal data transferring mechanisms.

2. Related Art

Over the past several decades, society has placed an increasingly larger demand on the speed at which it expects computers to operate. A tremendous amount of effort and resources have been spent to satisfy this demand. As a result, the data transfer rate in computers has increased significantly. This increase in speed causes new problems. As data is read at a greater rate the allowable tolerance in the data window (clock cell) decreases.

In practice, data streams contain bit jitter or imperfect bit spacing due to a variety of causes, including: varying code sequences, head roll, variations in disk drive speed, and magnetic crowding effects. As a result, data phase errors must be quickly reduced in order to keep data transfer accurate.

The difficulty involved in synchronizing two or more devices is a concern which has been addressed frequently. In general, when each device has its own clock, the problem is that these clocks must be synchronized in order to allow meaningful interaction between the devices. When only clocks are involved the solution is fairly straightforward. A conventional phase-locked-loop is used to compare one clock to another. If the clocks are out of phase a phase detector sends an appropriate current to an RC filter. This RC filter generates a voltage that directs a voltage controlled oscillator to modify the clock rate. The two clocks are quickly "locked" to each other and meaningful interaction can occur.

When data is being transmitted, however, the problem of synchronizing the devices becomes more complicated. When receiving a data signal a phase detector is concerned about two items: first, is there data in the data window; and, second, if there is data, by how much is the data out of phase with respect to the receiving device's data window. The data window is the time allotted for each data bit to be read by the receiving device's clock. The data window is also known as a clock cell. A phase detector that must predetermine whether there is data in the next data window is more complicated in structure than one that can discern this information using other methods.

Ideally a data transition, which is the leading edge of a data bit, occurs at the center of a data window. If a data transition occurs early in the data window then the phase detector knows that data is present and a signal indicating the phase shift of the data transition can begin immediately. However, if a data transition does not appear by the center of the data window then a problem occurs. In order to adjust for a data-late transition the phase detector must begin its phase error signal at the center of the data window. However at this point the phase detector does not know if there is a data transition in this data window. Therefore the signal cannot be generated without using complicated logic.

Another problem facing phase-locked loops is that a modification in the voltage controlled oscillator only affects future data. Adjusting for random or one-time only errors is counterproductive. This is because such adjustments to the clock, and therefore the data window, will not generally ensure that future data transitions are at the center of the data window. Magnetic crowding is an example of the type of data phase error that is random. Variations in disk drive speed, e.g., because of slippage, is a condition which will cause data phase errors to appear consistently in future data windows.

Generally, phase-locked loops are used to synchronize pulses. A phase-locked loop contains a phase detector, amplifier, and a voltage-controlled oscillator (VCO). If two clocks are involved, the phase detector compares two frequencies, an input frequency and a voltage controlled oscillator frequency. The phase detector generates an output that is a measure of their phase difference. This output, or phase-error signal, is then filtered and amplified before reaching the voltage controlled oscillator. The voltage controlled oscillator's frequency is altered in the direction of the incoming frequency. The voltage controlled oscillator should quickly "lock" onto the incoming frequency.

The conventional phase detectors used in phase-locked loops are sensitive to the relative timing of edges between the input signal frequency and the voltage controlled oscillator. The internal circuitry generates either lead or lag output pulses. Which pulse is generated depends on when the transitions of the input signal occur with respect to the voltage controlled oscillator frequency. The width of these pulses is equal to the time between the edges of the voltage controlled oscillator frequency, i.e., the time between the center of the data window, and the signal transition. These pulses are input into a charge pump which generates either a sink or source current depending on whether the signal is late or early, see generally *IBM Technical Disclosure Bulletin*, Vol. 27, No. 9, (February 1985), incorporated herein by reference.

Some current data phase-locked loops analyze an incoming data stream one data window at a time. A data transition is sent to a data phase detector. A signal is then output corresponding to the phase error of the data transition. The phase error is the phase difference between the time of actual data transition and the center of the data window. Recognizing that the voltage controlled oscillator should modify its signal based on an average of several data bits, the current technology uses filters to store a charge until the next data window. This technique does not provide the opportunity to use a greater sampling of data when generating the error signal. Therefore its effectiveness is limited.

Other conventional data phase-locked loops simply adjust the voltage controlled oscillator as it encounters each data bit. The problem with this technique is that all errors, consistent and random, are treated equally and affect the voltage controlled oscillator equally. See, e.g., *IBM Technical Disclosure Bulletin*, Vol. 25, No. 3B (August 1982), incorporated herein by reference.

Since voltage controlled oscillators make corrections affecting only future data, the random errors should not cause the voltage controlled oscillator to alter the data window. Instead, only consistently occurring errors should affect the voltage controlled oscillator.

SUMMARY OF THE INVENTION

The present invention reduces the effect that random errors have on the data window adjustments. This is accomplished by producing an error signal based on at least two different data windows. The preferred embodiment of this invention uses five data windows. A data stream passes through a data phase detector. This data phase detector produces an output signal based on the phase difference between the time of the actual data transition and the time of an ideal data transition. An ideal data transition occurs at the center of the data window. Looking at several data windows simultaneously diminishes the effect of phase errors from any individual data transition. This result occurs because the signals of all the data phase detectors are added together and averaged. Therefore the consistent data phase errors will still be adjusted for while the effects of random data phase errors are reduced.

The present invention is a unique system and method for reducing the effect of random data phase errors when attempting to synchronize the data window with the incoming data stream, while maintaining the effect that consistent errors have on the synchronization process.

BRIEF DESCRIPTION OF THE DRAWINGS

Various devices, features and attendant advantages of the present invention can be more fully appreciated as they become better understood with reference to the following detailed description of the present invention when considered in connection with the accompanying drawings, in which.

DETAILED DESCRIPTION OF THE PREFERRED EMBODIMENTS

1. General Overview

The system and method of the present invention enables clock corrections to be made when receiving data. These correction are made by adjusting for consistently occurring errors while diminishing the effect that less consistent errors have on the adjustment. An example of a consistent error is mechanical speed interface variations. Magnetic crowding effects is an example of an inconsistent error. More specifically, the present invention relates to a computer based system and method for receiving data from memory and adjusting for mechanical speed variations of the external and/or internal data transferring mechanisms.

Figure 1:
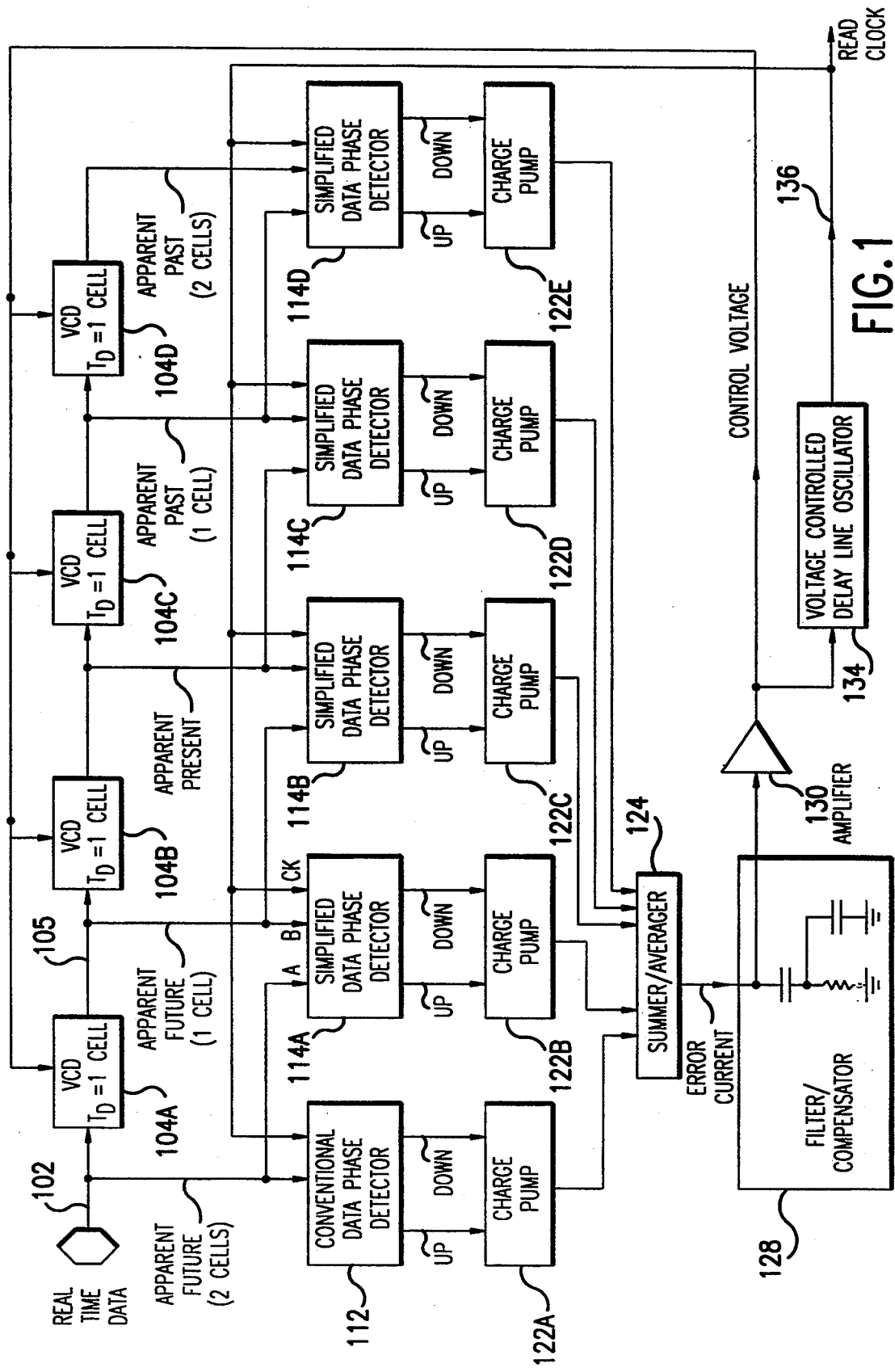
FIG. 1 shows the overall control and flow of the Enhanced Phase Detector of this invention.

Referring to FIG. 1, a plurality of voltage controlled delays (VCD) 104A-D, are serially connected output to input. The input of the first voltage controlled delay 104A is coupled to incoming data signal line 102. The output of each voltage controlled delay device 104A-D is also coupled to a corresponding simplified data phase detector 114A-D. A conventional data phase detector 112 is coupled to the incoming data signal line 102. All data phase detectors 112, 114A-D are coupled to a charge pump 122A-E. The charge pumps 122A-E are coupled to a summer/averager 124. The summer averager, in turn, is coupled to a filter/compensator 128. The filter/compensator 128 is coupled to an amplifier 130. The amplifier 130 is coupled to the voltage controlled delay devices 104A-D and to a voltage controlled delay line oscillator 134. The output of the VCO 134 is provided as an input to each simplified data phase detector 114A-D.

Referring to FIG. 1, the enhanced phase detector of the present invention receives a data signal on line 102 via a bus or other mechanism for transporting data. The data signal is immediately sent to three devices: the first voltage controlled delay device (VCD) 104A, the conventional data phase detector 112 and the first simplified data phase detector 114A. Alternative embodiments of the present invention foresee the use of different delay devices.

The voltage controlled delay device 104A receives the data signal, hereinafter signal A, and delays this signal for a certain period of time and then outputs the time delayed signal. The preferred embodiment of the present invention contemplates a delay of one clock cell (data window), although other embodiments contemplate different delay lengths.

The conventional data phase detector 112 uses only one data input line and one clock input. The conventional data phase detector 112 determines whether a bit transition occurs, i.e., whether data is received during the current data window. The conventional data phase detector 112 also determines whether this data is received early or late with respect to the data window. The conventional data phase detector transmits the above determined information by sending out a charge-up or charge-down signal.

The simplified data phase detector 114A performs similarly to the conventional data phase detector 112. One difference is that the simplified data phase detector 114A has an additional data input line. This data input line is used to determine whether a bit transition occurs during the current data window. Additionally, the data input line determines whether this data is received early or late with respect to the data window. The data signal passing through the second data input line is one data window later in time compared to the first data input line, hereinafter signal B. Access to "apparent future" data, i.e., signal A, enables simplification of the necessary logic for achieving the same results as the conventional data phase detector 112. The output of the simplified data phase generator 114A is a charge-up or charge-down signal.

The present invention decreases the effect that random shifting errors have on the clock correction by looking at "apparent future" data and, possibly, "apparent past" data. A consistent error, e.g., a "slip" of a mechanical speed interface, would cause the subsequent data to be either consistently early or consistently late with respect to the data window. The consistency involved with this type of data phase error makes a phase adjustment, whose only effect is on future cells, desirable. Conversely, a random error, e.g., magnetic crowding effects, varies from data window to data window and therefore is not desirable to correct for, since a phase adjustment only affects future cells and the phase error may not occur in these cells.

The preferred embodiment of this invention has one conventional data phase detector 112 and at least four additional simplified data phase detectors, 114A, 114B, 114C, 114D. Alternative embodiments envision only one additional simplified data phase detector or that only conventional data phase detectors are used. Increasing the number of data phase detectors, decreases the effect a random phase error will have on the subsequent clock correction. For example, in the preferred embodiment, if data in one data window has a random error while the other four have consistent errors, the summer/averager 124, discussed below, will sum the outputs of all five data phase detectors and average them to produce one error current. Therefore the effect of the random error will be reduced to twenty percent of its original effect. This result occurs because the random error is divided by the number of data phase detectors. In the preferred embodiment five data phase detectors are used.

Each data phase detector has a corresponding charge pump 122A, 122B, 122C, 122D, 122E, which receives the charge-up or charge-down signal and outputs a current based on this input. The output current of the charge pump is in the form of a current source or current sink. The output current then enters the summer-/averager 124 which adds each current and averages the total current based on the total number of data phase detectors, conventional and simplified. The summed and averaged current is termed the error current.

The error current charges a capacitor in a filter/compensator 128. This creates a voltage which is applied to amplifier 130. The resulting control voltage 132 is used as an input to the voltage controlled delay devices 104A, 104B, 104C, 104D, and the voltage controlled delay line oscillator 134. The voltage controlled delay line oscillator 134 modifies the clock rate and thus the length of the data window, based on the control voltage. The modified CLOCK signal 136 is applied as an input to the data phase detectors 112, 114A, 114B, 114C, 114D.

2. Simplified Data Phase Detector

Figure 2:
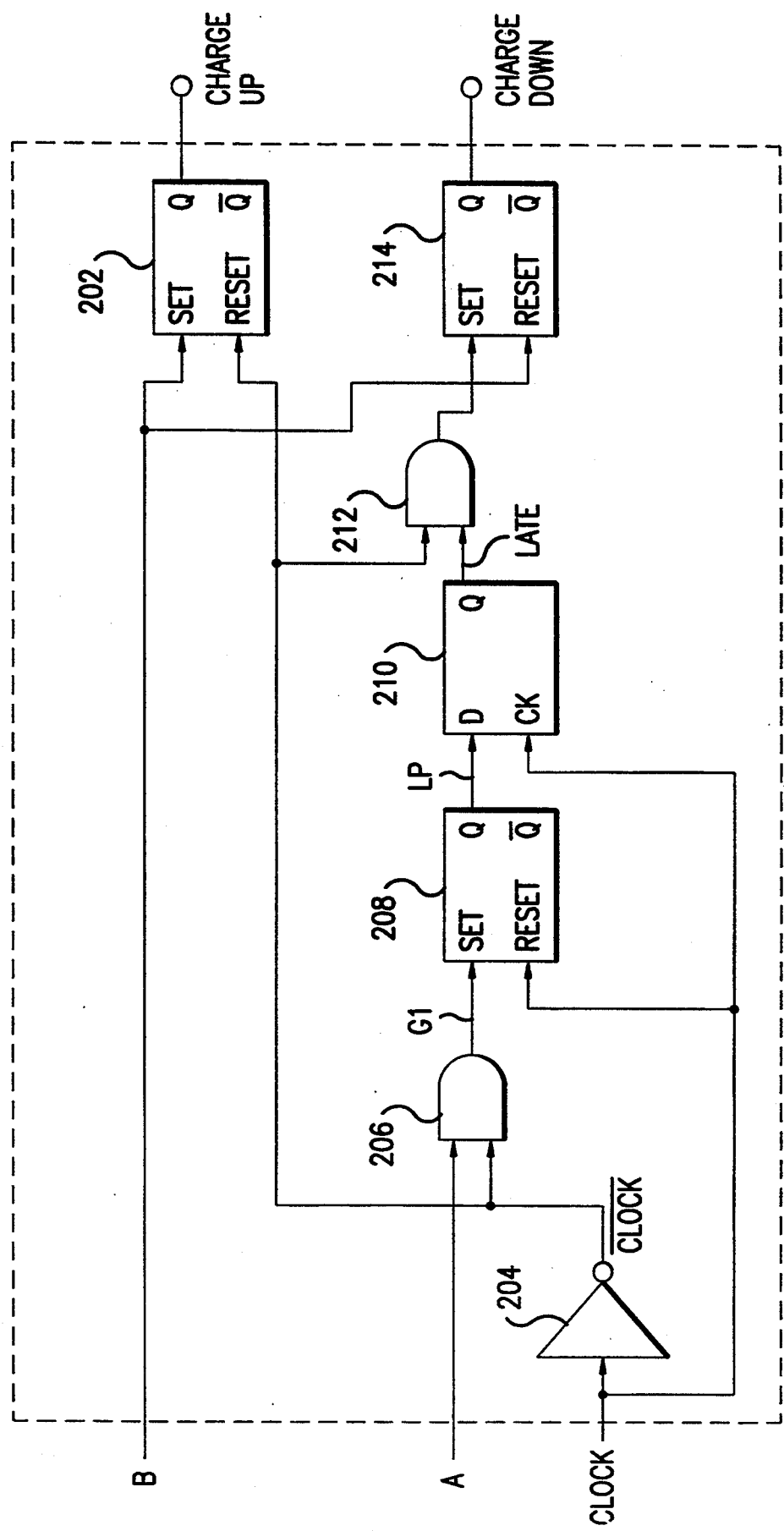
FIG. 2 shows a logic diagram of a simplified data phase detector.

FIG. 2 shows one example of the logic that can be used to create the simplified data phase detectors 114. An invertor 204 is coupled to a first flip-flop 202, a first AND gate 206, and a second AND gate 212. The AND gate 206 is coupled to a second flip-flop 208. The second flip-flop 208 is coupled between the AND gate 206 and a D-type flip-flop 210. The D-type flip-flop 210 is coupled between the second flip-flop 208 and the second AND gate 212. The second AND gate 212 is coupled to the invertor 204, the D-type flip-flop 210, and a third flip-flop 214.

Signals A and B and CLOCK are received into the simplified data phase detector. Recall from FIG. 1 that signal B has passed through a voltage controlled delay and therefore signal A represents "apparent future" data when compared to signal B, i.e., signal B is equal to a delayed signal A. Signal B is sent to the SET input of a flip-flop 202. The CLOCK splits with one lead passing through an invertor 204. The resulting CLOCK-NOT signal is sent to the RESET input of flip-flop 202. The output of flip-flop 202 is a charge-up signal.

Signal A is sent to AND gate 206 where it combines with signal CLOCK-NOT. The output of AND gate 206 is signal G1. Signal G1 indicates that data which appears on signal A is late. Signal G1 is connected to the SET input of flip-flop 208. The RESET input of flip-flop 208 is connected to CLOCK. The output of flip-flop 208 is signal LP. Signal LP is a flag for the next data window, indicating that the data transition in the data window is late. Signal LP is connected to D-type flip-flop 210 at the D input. The CK input of D-type flip-flop 210 is the CLOCK signal. The D-type flip-flop results in a LATE signal. The LATE signal remains high until the next positive edged CLOCK transition, i.e., low-to-high CLOCK transition. This LATE signal is combined with the CLOCK-NOT signal by AND gate 212. The output of this AND gate is a signal which is connected to the SET input of flip-flop 214. The RESET input of flip-flop 214 is connected to signal B. The output of flip-flop 214 is a charge down signal.

Figure 3:
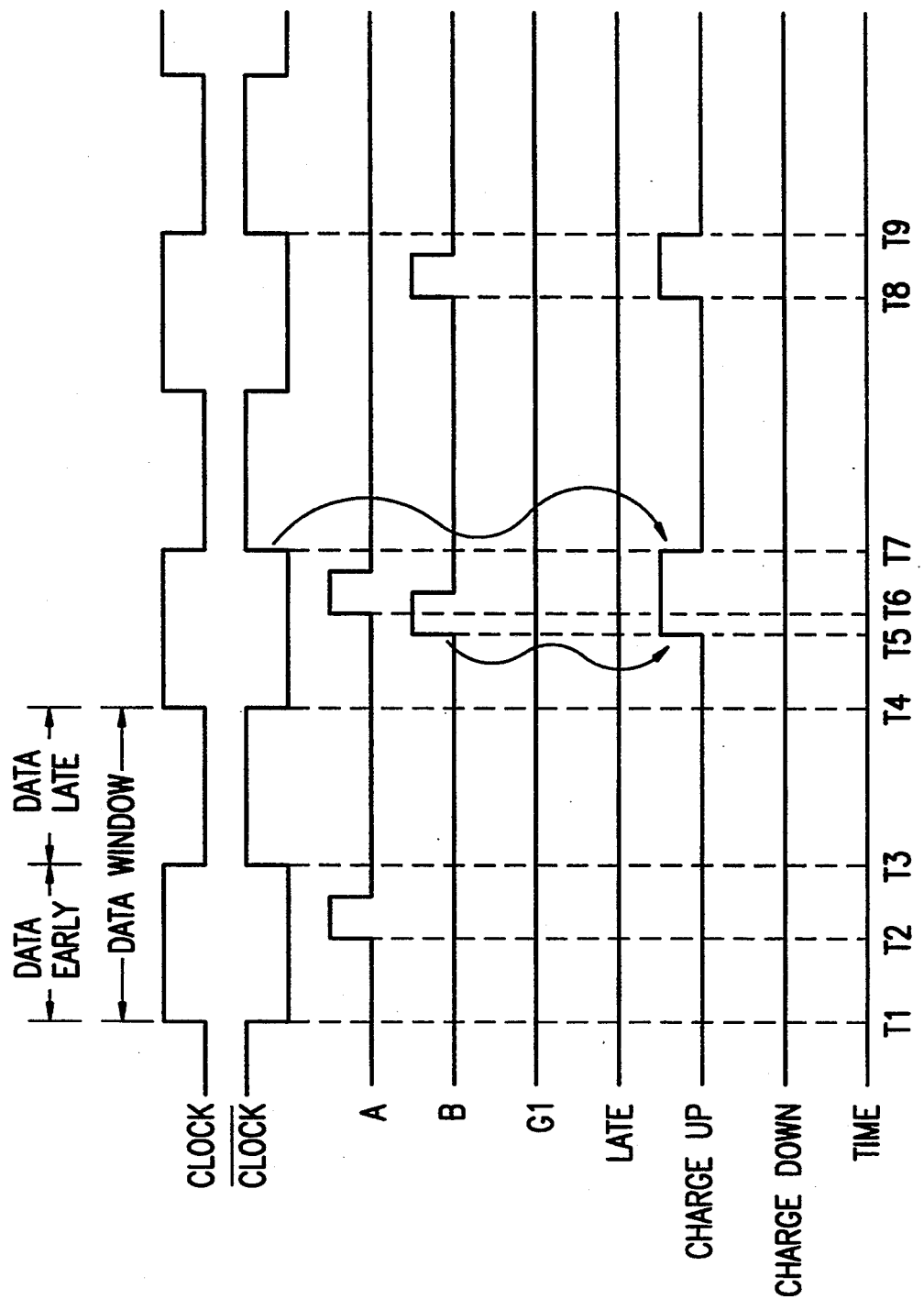
FIG. 3 is a timing diagram for the simplified data phase detector showing the situation when a data transition is early with respect to the data window.

FIG. 3 is a timing diagram for the simplified data phase detector. One clock cycle represents a data window, i.e., the time between times T1 and T4. Ideally data transitions should begin as the CLOCK switches from high-to-low, i.e., the center of the data window T3. If the data transition begins while CLOCK is high the data is early and a CHARGE UP signal should be generated. If the data transition begins while CLOCK is low the data is late and a CHARGE DOWN signal should be generated. The purpose of the CHARGE UP and CHARGE DOWN signals are to modify the clock rate so that a data transition begins at the ideal time, i.e, the center of the data window.

In FIG. 3 the data signals are early. Data early signals are examined separately to simplify their analysis. However, the preferred embodiment is capable of handling signals that contain both early and late transitions. Signal A represents several data windows. Signal B represents signal A delayed by one data window. A data transition on signal A occurs at T2. At T2 the CLOCK is high. Therefore the data is early. In the simplified data phase detector this data transition enters AND gate 206 along with the CLOCK-NOT signal. The CLOCK-NOT signal is currently low, therefore signal G1 remains low. Since G1 does not go high nothing further happens with respect to this data transition on signal A. The same analysis applies to signal A's data transition at T6.

Signal B is identical to signal A except that signal B is delayed one data window as is shown by signal B's data transition at T5. When this data transition begins it is input into the SET input of flip-flop 202 causing the CHARGE-UP line to go high. The CHARGE-UP line remains high until flip-flop 202 is reset. The RESET input for flip-flop 202 is the CLOCK-NOT signal. Therefore the CHARGE-UP line remains high until the CLOCK-NOT signal becomes high which occurs at time T7. At T7 the CHARGE-UP line becomes low. The same analysis applies to signal B's data transition at T8.

Figure 4:
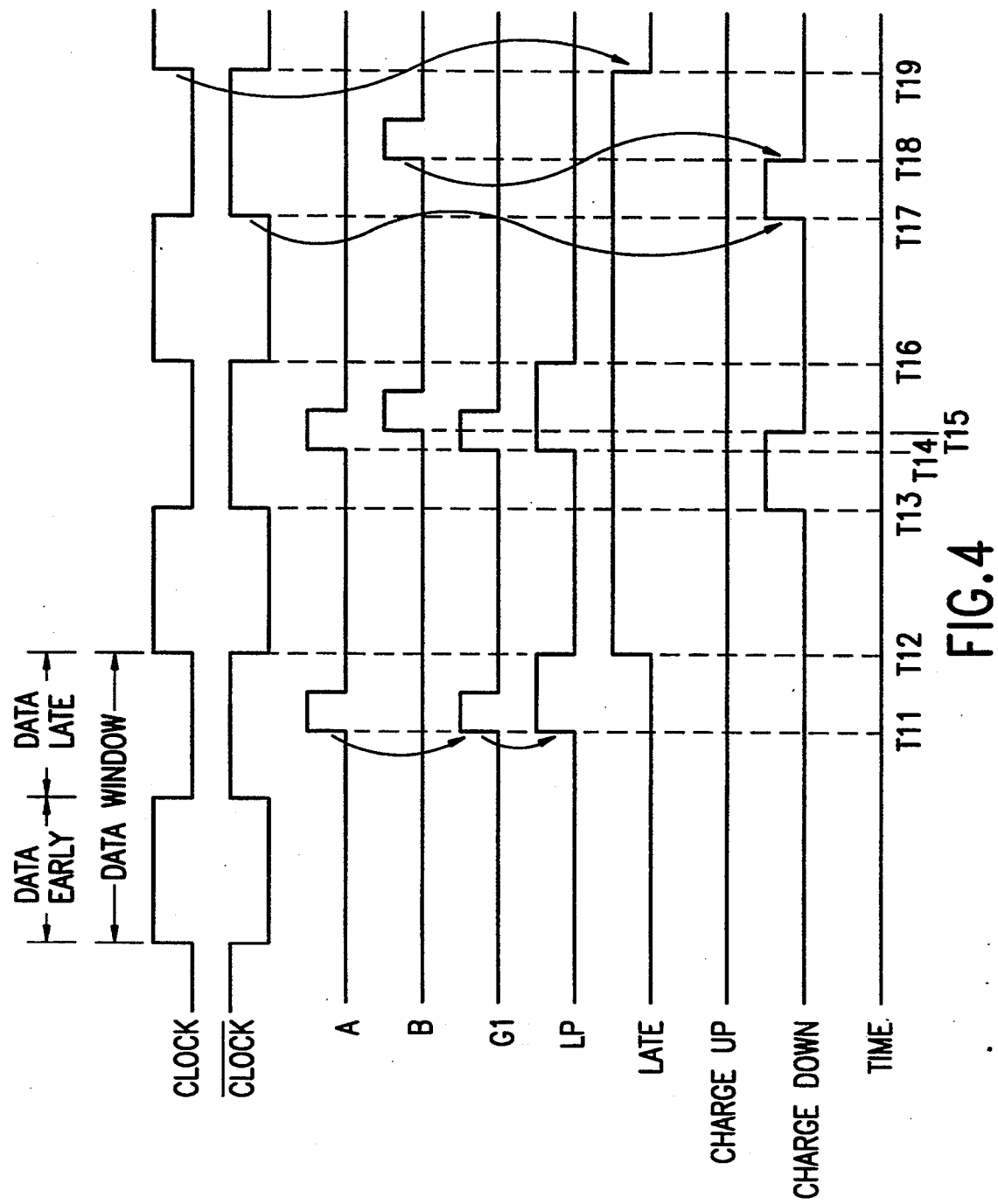
FIG. 4 is a timing diagram for the simplified data phase detector showing the situation when a data transition is late with respect to the data window.

FIG. 4 shows a timing diagram for the simplified data phase detector under conditions where the data signals are late. Signal A represents several data windows. Signal B represents signal A delayed by one data window. A data transition on signal A occurs at time T11 while CLOCK is low. Therefore the data is late. In the simplified data phase detector this data transition at T11 is on signal A. Therefore the signal enters AND gate 206 along with the CLOCK-NOT signal. Since the CLOCK-NOT signal is high at T11 signal G1 becomes high at the same time. Signal G1 is connected to the SET input of flip-flop 208. Since signal G1 is high and CLOCK, which is the RESET input of flip-flop 208, is low the output of flip-flop 208, signal LP, also becomes high at T11. In the preferred embodiment signal LP is then input into a positive edge triggered D-type flip-flop 210. Alternative embodiments envision the use of other types of flip-flops. When the CLOCK signal turns positive at T12 the output of D-type flip-flop 210 becomes high, which is the signal LATE. The LATE signal will remain high until the next positive edge transition of the CLOCK. This transition occurs at T16. In FIG. 4 signal A's next data transition at T14 is also late. This subsequent late transition causes the LATE signal to remain high at T16. The LATE signal combines with the CLOCK-NOT signal in AND gate 212. The output of AND gate 212 becomes high when the CLOCK-NOT signal becomes high at T13. The output of AND gate 212 is connected to the SET input of flip-flop 214. At T13 the output of AND gate 212 is high, and the B signal is low. Therefore at T13 a CHARGE DOWN signal is generated. This CHARGE DOWN signal remains high until there is a data transition in signal B which occurs at T15. This data transition will always occur in the subsequent one-half data window, i.e., between T13 and T16. The same analysis applies to the data transition on signal A at T4.

Signal B is identical to signal A except that signal B is delayed one data window as is shown by the data transition on signal B at T15. When this data transition begins it is input into the SET input of flip-flop 202. The CHARGE-UP line does not become high because the RESET input for flip-flop 202 is the CLOCK-NOT signal which is also high, therefore the CHARGE-UP line remains low. The same analysis applies to signal B's data transition at T18.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A system for diminishing the effect of bit shift variations during clock corrections, comprising:
    a first data delay device to receive a data signal and to delay said data signal to produce a first delayed data signal, a delay of said first data delay device being controlled by a control voltage;
    a voltage controlled delay line oscillator to produce a clock signal, a frequency of said clock signal being controlled by said control voltage;
    a first data phase detector to receive the data signal and said clock signal and to produce a first charge control signal in response thereto;
    a second data phase detector to receive the data signal, said first delayed data signal and said clock signal and to produce a second charge control signal in response thereto;
    a first charge pump to produce a first current in response to said first charge control signal;
    a second charge pump to produce a second current in response to said second charge control signal;
    a summer/averager to produce an average current in response to said currents from said charge pumps; and
    a filter/compensator to produce said control voltage from said average current.

2. The system of claim 1, wherein said second data phase detector comprises:
    an invertor to receive said clock signal from said voltage controlled delay line oscillator and to output an inverted clock signal;
    a first AND gate to receive said data signal and said inverted clock signal and to output a first set signal;
    a first set/reset flip-flop having a SET input to receive said first set signal and a RESET input to receive said clock signal;
    a D-type flip-flop having a D input to receive an output from said first set/reset flip-flop, and a clock input to receive said clock signal;
    a second AND gate to receive said inverted clock signal and an output from said D-type flip-flop and to output a second set signal;
    a second set/rest flip-flop having a SET input to receive said delayed data signal, and a RESET input to receive said inverted clock signal, said second set/reset flip-flop outputting a charge-up signal; and
    a third set/reset flip-flop having a SET input to receive said second set signal and a RESET input to receive said delayed data signal, said third set/reset flip-flop outputting a charge-down signal, said charge-up signal and said charge-down signal representing said second charge control signal of said second data phase detector.

3. The system of claim 1, further comprising:
    a second data delay device to receive said first delayed data signal and to delay said first delayed data signal to produce a second delayed data signal, a delay of said second data delay device being controlled by said control voltage;
    a third data phase detector to receive said first delayed data signal, said second delayed data signal and said clock signal and to produce a third charge control signal in response thereto; and
    a third charge pump to produce a third current in response to said third charge control signal and to provide said third current to said summer-/averager.

4. The system of claim 3, further comprising:
    a third data delay device to receive said second delayed data signal and to delay said second delayed data signal to produce a third delayed data sign, a delay of said third data delay device being controlled by said control voltage;
    a fourth data phase detector to receive said second delayed data signal, said third delayed data signal and said clock signal and to produce a fourth charge control signal in response thereto; and
    a fourth charge pump to produce a fourth current in response to said fourth, charge control signal and to provide said fourth current to said summer-/averager.

5. The system of claim 4, further comprising:
    a fourth data delay device to receive said third delayed data signal and to delay said third delayed data signal to produce a fourth delayed data signal, a delay of said fourth data delay device being controlled by said control voltage;
    a fifth data phase detector to receive said third delayed data signal, said fourth delayed data signal and said clock signal and to produce a fifth charge control signal in response thereto; and a fifth charge pump to produce a fifth current in response to said fifth charge control signal and to provide said fifth current to said summer/averager.

6. A system for synchronizing a clock signal to a data signal and for diminishing the effect of bit shift variations, comprising:

first delay means for delaying the data signal by a first delay period to produce a first delayed data signal, said first delay period being controlled by a control voltage;

second delay means for delaying the data signal by a second delay period to produce a second delayed data signal, said second delay period being controlled by said control voltage;

first phase detector means for determining a phase difference between the clock signal and the data signal and for producing a first phase signal indicating said phase difference;

second phase detector means for determining a phase difference between the clock signal and said first delayed data signal and for producing a second phase signal indicating said phase difference;

third phase detector means for determining a phase difference between the clock signal and said second delayed data signal and for producing a third phase signal indicating said phase difference;

avenger means for receiving said phase signals from said phase detector means and for averaging said phase signals to produce said control voltage; and oscillator means, responsive to said control voltage, for producing the clock signal, wherein a frequency of the clock signal is controlled by said control voltage.

7. The system of claim 6, wherein said first delay period is equal to one clock cycle and wherein said second delay period is equal to two clock cycles.

8. The system of claim 7, wherein said avenger means comprises:

a plurality of charge pumps, each connected to a corresponding phase detector, wherein each charge pump produces a current proportional to said phase signal from said corresponding phase detector;

a summer/averager to receive said currents from said plurality of charge pumps and to average said currents to produce an average current; and a filter/compensator to produce said control voltage from said average current.

9. The system of claim 8, wherein said oscillator means is a voltage controlled oscillator.

10. The system of claim 6, further comprising:

third delay means for delaying the data signal by a third delay period to produce a third delayed data signal, said third delay period being controlled by said control voltage; and fourth phase detector means for determining a phase difference between the clock signal and said third delayed data signal and for producing a fourth phase signal indicating said phase difference.

11. The system of claim 10, further comprising:

fourth delay means for delaying the data signal by a fourth delay period to produce a fourth delayed data signal, said fourth delay period being controlled by said control voltage; and fifth phase detector means for determining a phase difference between the clock signal and said fourth delayed data signal and for producing a fifth phase signal indicating said phase difference.

12. The system of claim 11, wherein said first delay period is equal to one clock cycle, said second delay period is equal to two clock cycles, said third delay period is equal to three clock cycles and said fourth delay period is equal to four clock cycles.

13. The system of claim 12, wherein said avenger means comprises:

a plurality of charge pumps, each connected to a corresponding phase detector, wherein each charge pump produces a current proportional to said phase signal from said corresponding phase detector;

a summer/averager to receive said currents from said plurality of charge pumps and to average said currents to produce an average current; and a filter/compensator to produce said control voltage from said average current.

14. The system of claim 13, wherein said oscillator means is a voltage controlled oscillator.

15. A method for minimizing the effect of bit shift variations in a data signal, comprising the steps of:

(1) generating a clock signal having a frequency which varies as a function of a control signal;

(2) generating a first phase signal representing a phase difference between the data signal and said clock signal;

(3) delaying the data signal by a first delay to produce a first delayed data signal, wherein a magnitude of said first delay is controlled by said control voltage;

(4) generating a second phase signal representing a phase difference between said clock signal and said first delayed data signal;

(5) delaying the data signal by a second delay to produce a second delayed data signal, wherein a magnitude of said second delay is controlled by said control voltage;

(6) generating a third phase signal representing a phase difference between said clock signal and second delayed data signal; and (7) averaging said phase signals to produce said control voltage.

16. The method of claim 15, further comprising the steps before step (7) of:

(a) delaying the data signal by a third delay to produce a third delayed data signal, wherein a magnitude of said third delay is controlled by said control voltage;

(b) generating a fourth phase signal representing a phase difference between said clock signal and said third delayed data signal;

(c) delaying the data signal by a fourth delay to produce a fourth delayed data signal, wherein a magnitude of said fourth delay is controlled by said control voltage; and (d) generating a fifth phase signal representing a phase difference between said clock signal and said fourth delayed data signal.

17. The method of claim 16, wherein:

said fourth delayed data signal is produced by delaying said third delayed data signal by one clock period;

said third delayed data signal is produced by delaying said second delayed data signal by one clock period;

said second delayed data signal is produced by delaying said first delayed data signal by one clock period:

said first delayed data signal is produced by delaying the data signal by one clock period.

* * * * *